US008872211B2

(12) United States Patent
Ooyabu et al.

(10) Patent No.: US 8,872,211 B2
(45) Date of Patent: Oct. 28, 2014

(54) ELEMENT-CONNECTING BOARD, PRODUCING METHOD THEREOF, AND LIGHT-EMITTING DIODE DEVICE

(71) Applicants: Yasunari Ooyabu, Osaka (JP); Kazuhiro Fuke, Osaka (JP); Daisuke Tsukahara, Osaka (JP); Takashi Kondo, Osaka (JP)

(72) Inventors: Yasunari Ooyabu, Osaka (JP); Kazuhiro Fuke, Osaka (JP); Daisuke Tsukahara, Osaka (JP); Takashi Kondo, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/690,494

(22) Filed: Nov. 30, 2012

(65) Prior Publication Data
US 2013/0134467 A1    May 30, 2013

(30) Foreign Application Priority Data

Nov. 30, 2011 (JP) .................................. 2011-261702

(51) Int. Cl.
| | |
|---|---|
| *H01L 33/00* | (2010.01) |
| *F21V 21/00* | (2006.01) |
| *H01L 33/62* | (2010.01) |
| *H01L 33/46* | (2010.01) |
| *H05K 13/00* | (2006.01) |
| *H01L 25/075* | (2006.01) |

(52) U.S. Cl.
CPC ............... *H01L 33/46* (2013.01); *F21V 21/00* (2013.01); *H01L 33/62* (2013.01); *H01L 2224/48091* (2013.01); *H01L 25/0753* (2013.01); *H01L 2224/48247* (2013.01); *H05K 13/00* (2013.01)
USPC ..................................... 257/98; 257/E33.072

(58) Field of Classification Search
USPC ................................................... 257/E33.072
See application file for complete search history.

(56) References Cited

U.S. PATENT DOCUMENTS

| | | | | |
|---|---|---|---|---|
| 7,161,190 | B2 * | 1/2007 | Chikugawa | 257/99 |
| 7,326,041 | B2 * | 2/2008 | Ochiai et al. | 425/116 |
| 2001/0042865 | A1 * | 11/2001 | Oshio et al. | 257/100 |
| 2003/0006421 | A1 | 1/2003 | Yasukawa et al. | |
| 2004/0217369 | A1 * | 11/2004 | Nitta et al. | 257/99 |
| 2008/0194055 | A1 * | 8/2008 | Shimizu et al. | 438/65 |
| 2011/0186893 | A1 | 8/2011 | Kondo et al. | |

FOREIGN PATENT DOCUMENTS

| | | |
|---|---|---|
| JP | 07-288341 A | 10/1995 |
| JP | 2011-159874 A | 8/2011 |

OTHER PUBLICATIONS

Non-Final Office Action dated Aug. 18, 2014, issued from the U.S. Patent and Trademark Office in U.S. Appl. No. 14/315,948.

* cited by examiner

*Primary Examiner* — Lex Malsawma
(74) *Attorney, Agent, or Firm* — Sughrue Mion, PLLC

(57) ABSTRACT

An element-connecting board is a lead frame for allowing a light emitting diode element to be connected to one side thereof in a thickness direction. The element-connecting board includes the lead frame which is provided with a plurality of leads disposed with spaces from each other and a first insulating resin portion which is light reflective and fills the spaces.

9 Claims, 11 Drawing Sheets

FIG.1
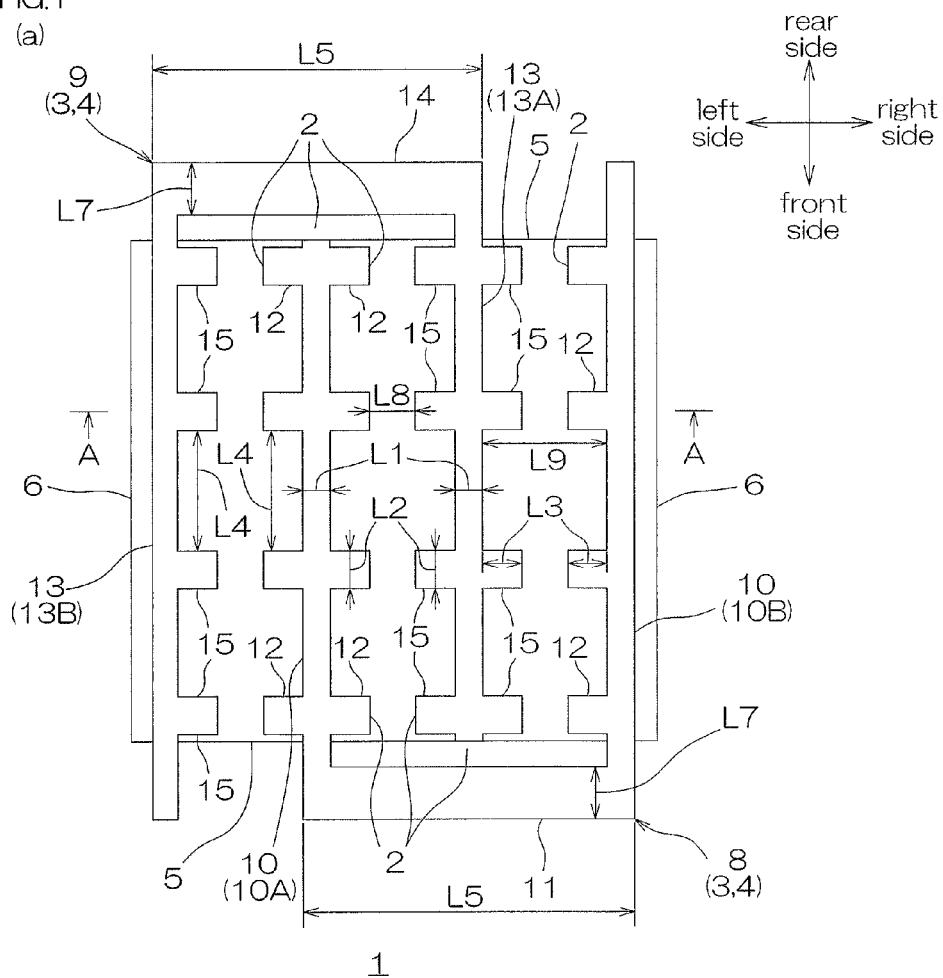
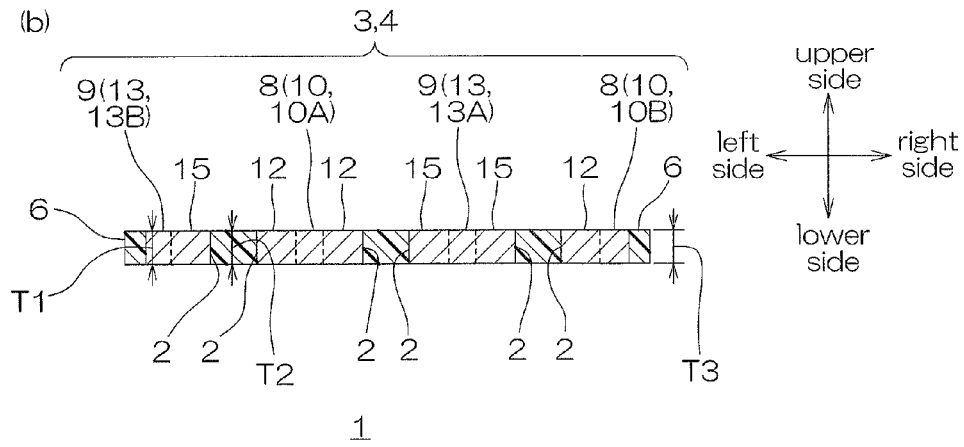

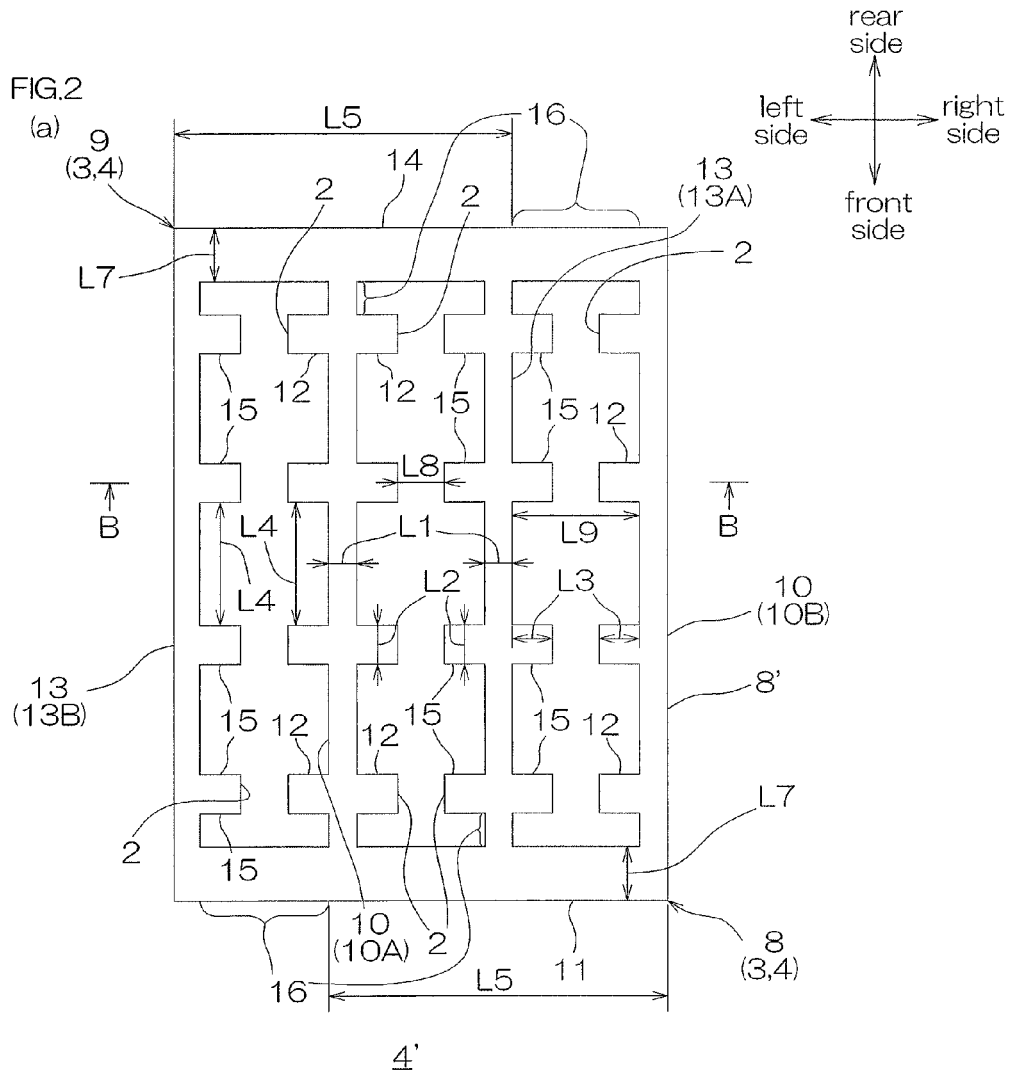
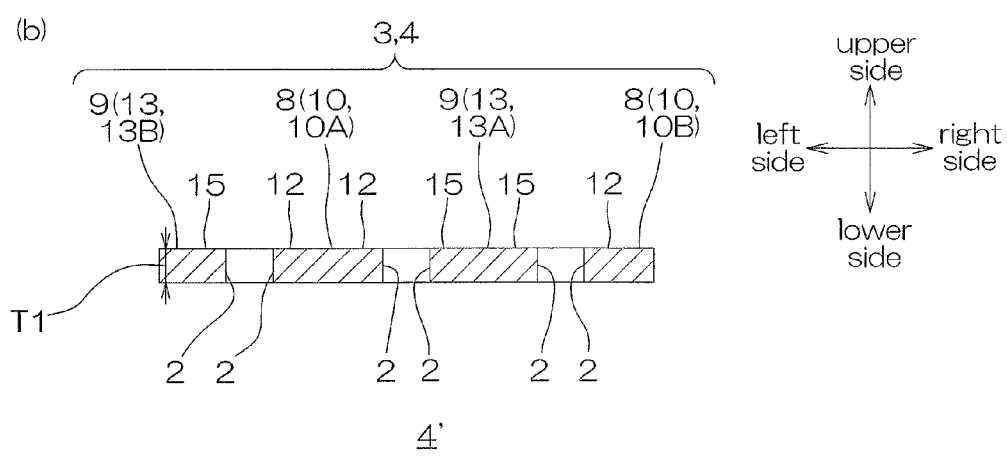

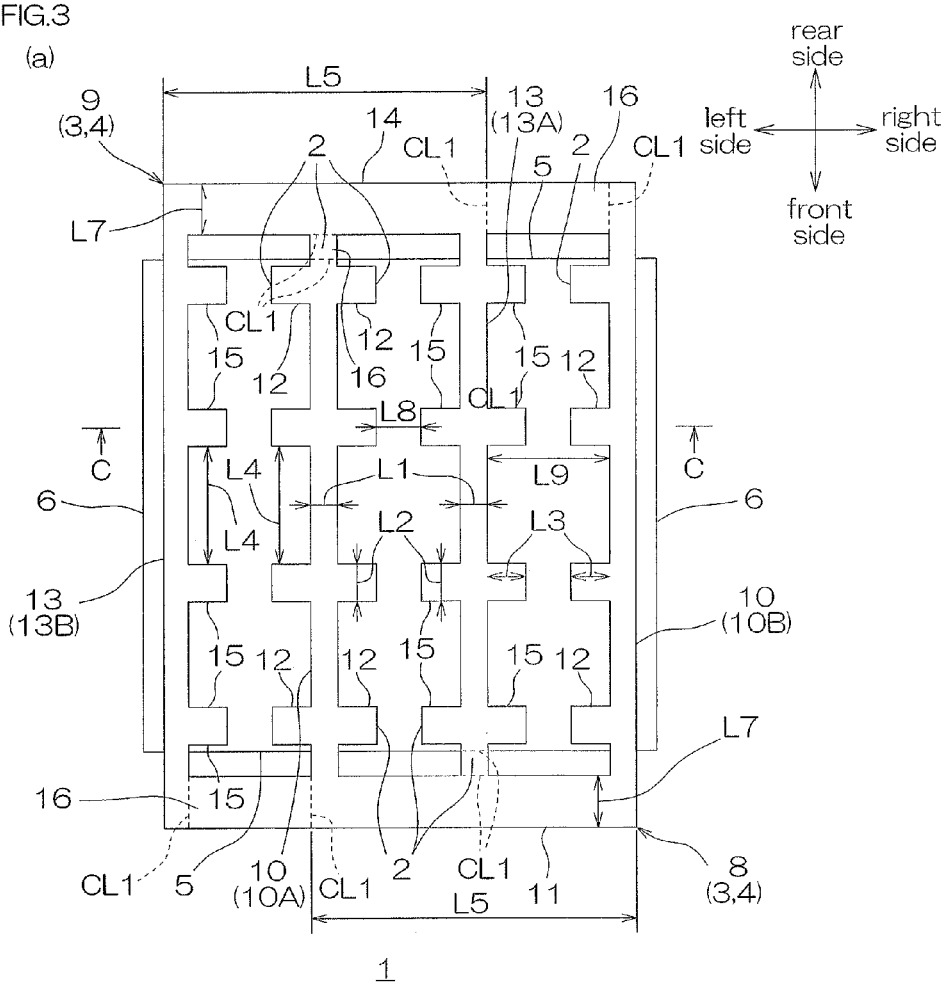
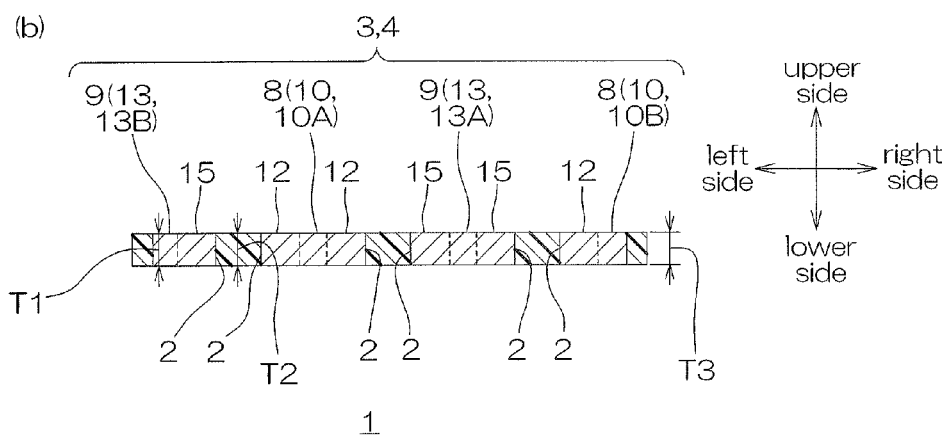
FIG.3

FIG.8
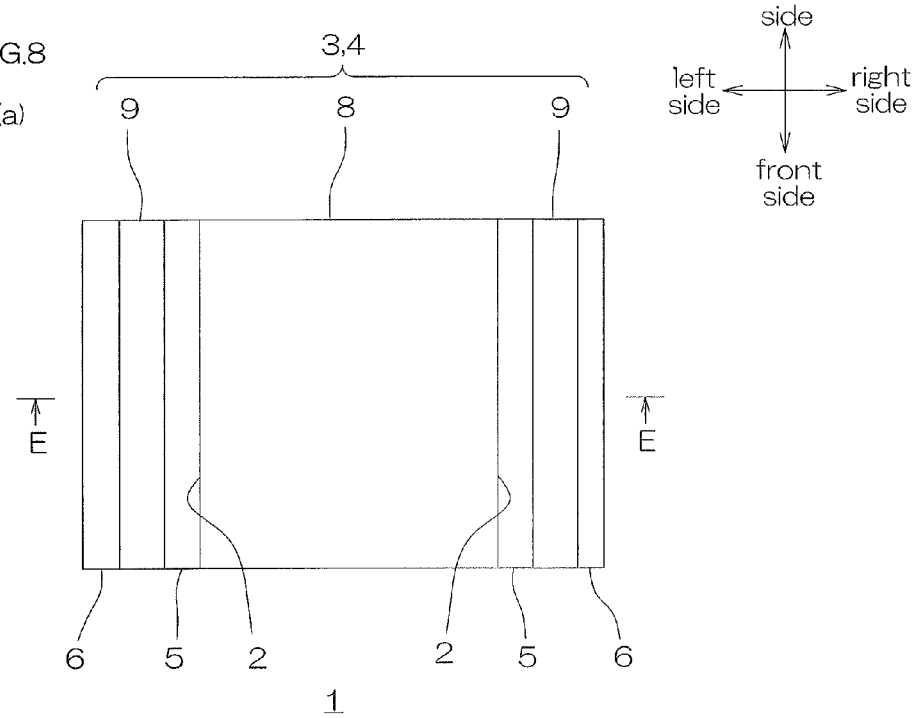
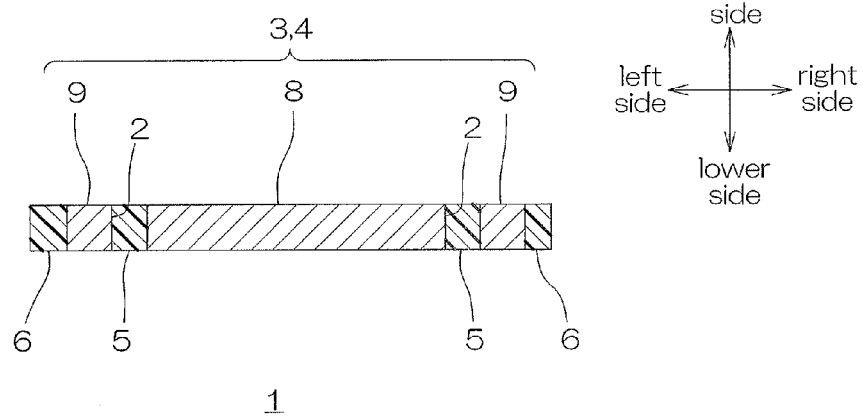

FIG.9
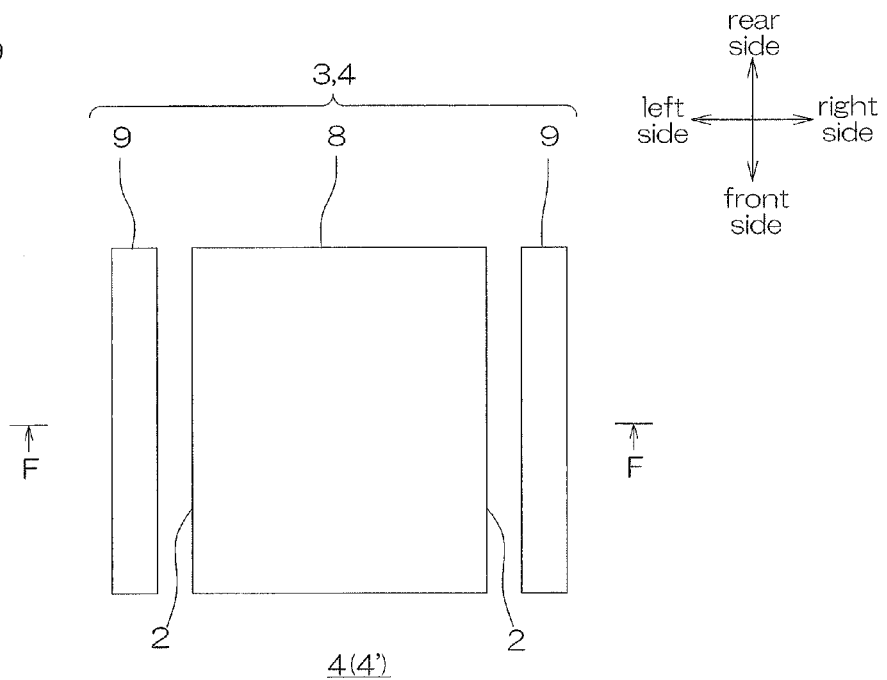
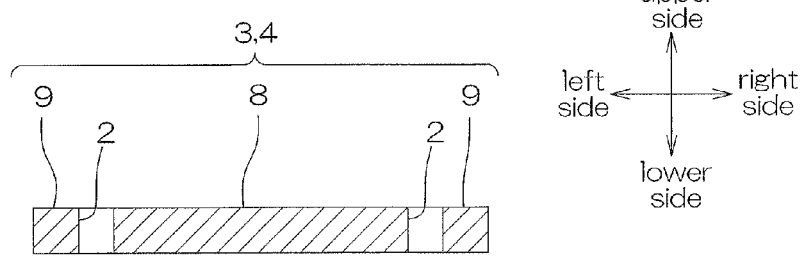

FIG.10
(a)
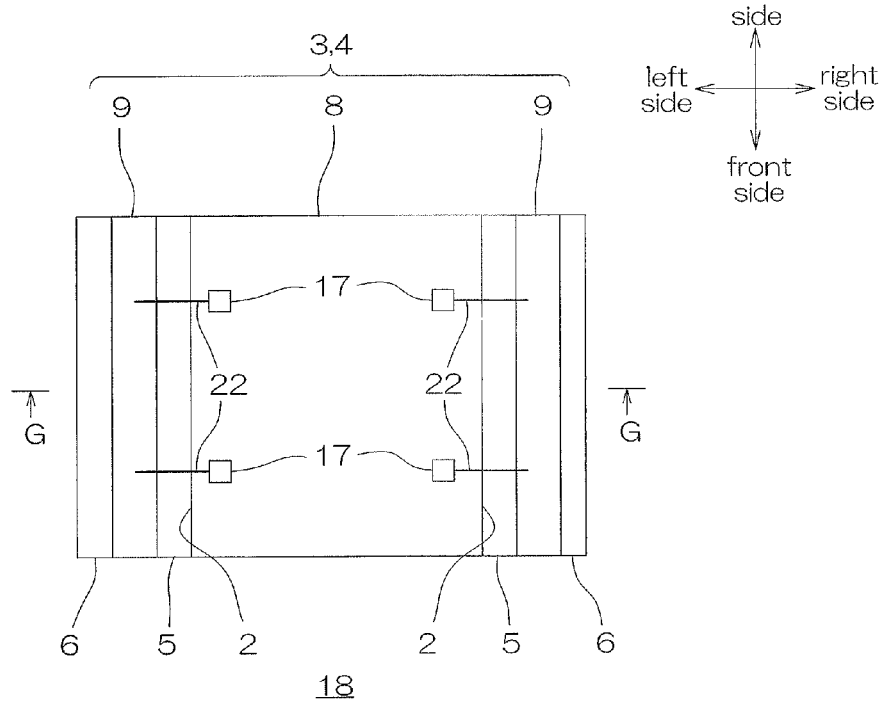
(b)
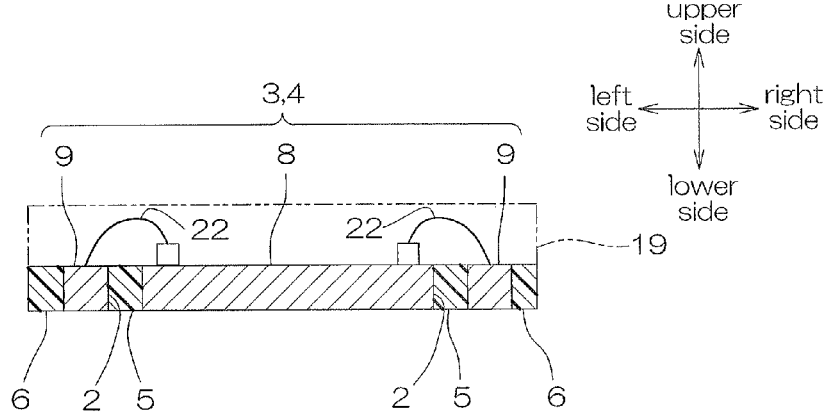

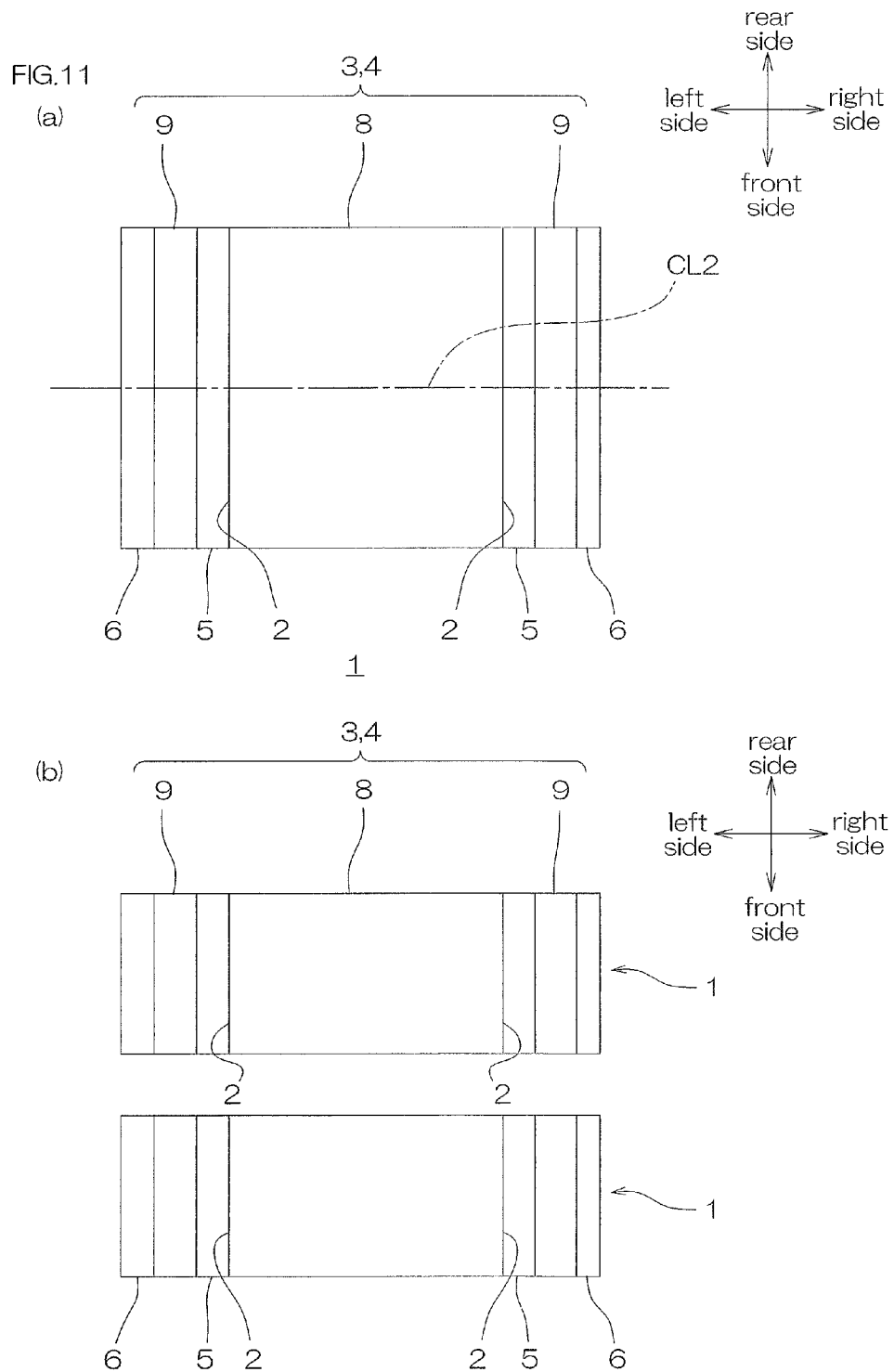

ELEMENT-CONNECTING BOARD, PRODUCING METHOD THEREOF, AND LIGHT-EMITTING DIODE DEVICE

CROSS-REFERENCE TO RELATED APPLICATION

The present application claims priority from Japanese Patent Application No. 2011-261702 filed on Nov. 30, 2011, the contents of which are hereby incorporated by reference into this application.

BACKGROUND OF THE INVENTION

1. Field of the Invention

The present invention relates to an element-connecting board, a producing method thereof, and a light emitting diode device, to be specific, to an element-connecting board to which a light emitting diode element is connected, a producing method thereof, and a light emitting diode device.

2. Description of Related Art

A light emitting diode device is provided with a conductive pattern, a light emitting diode element which is electrically connected thereto, and a reflecting wall which is disposed around the light emitting diode element. In such a light emitting diode device, an electric power is supplied from the conductive pattern to the light emitting diode element, so that the light emitting diode element emits light and a part of the emitted light is reflected at the inner surface of the reflecting wall, and therefore, the luminous efficiency of a light emitting diode is improved.

For example, an LED display which is provided with a board; an electrically-conductive layer formed thereon; an LED chip connected thereon; a covering material formed on the board so as to surround the neighborhood of the LED chip; and a resin mold encapsulating the LED chip at the inner side of the covering material has been proposed (ref: for example, Japanese Unexamined Patent Publication No. H7-288341).

Also, in recent years, a method in which an optical semiconductor element is embedded by an encapsulating sheet to encapsulate the optical semiconductor element has been proposed (ref: for example, Japanese Unexamined Patent Publication No. 2011-159874).

SUMMARY OF THE INVENTION

However, there is a disadvantage that in the case where the LED chip of the LED display in Japanese Unexamined Patent Publication No. H7-288341 is encapsulated by the encapsulating sheet in Japanese Unexamined Patent Publication No. 2011-159874, when the encapsulating sheet is attached to the LED chip so as to cover the LED chip, air is easily mixed between the encapsulating sheet and the LED chip because the covering material is disposed around the LED chip, so that the LED chip is not capable of being surely encapsulated.

On the other hand, there is a disadvantage that when the encapsulating sheet is attached to the board excluding the covering material in Japanese Unexamined Patent Publication No. H7-288341 so as to cover the LED chip, the luminous efficiency of the LED display is not capable of being sufficiently improved, while it can be suppressed that air is mixed between the encapsulating sheet and the LED chip.

It is an object of the present invention to provide an element-connecting board which is capable of surely encapsulating a light emitting diode element connected thereto by an encapsulating sheet and has an excellent light reflectivity, a producing method thereof, and a light emitting diode device which has an excellent luminous efficiency.

An element-connecting board of the present invention includes a lead frame for allowing a light emitting diode element to be connected to one side thereof in a thickness direction, which is provided with a plurality of leads disposed with spaces from each other, and a first insulating resin portion which is light reflective and fills the spaces.

In the element-connecting board of the present invention, it is preferable that the first insulating resin portion is formed from a reflecting resin composition containing an encapsulating resin composition and a light reflecting component.

In the element-connecting board of the present invention, it is preferable that a second insulating resin portion which is disposed at the other surface in the thickness direction and/or the side surface of the lead frame is further included.

A light emitting diode device of the present invention includes an element-connecting board including a lead frame which is provided with a plurality of leads disposed with spaces from each other and a first insulating resin portion which is light reflective and fills the spaces, and a light emitting diode element connected to one surface in a thickness direction of the lead frame.

In the light emitting diode device of the present invention, it is preferable that an encapsulating sheet which is formed at one side in the thickness direction of the element-connecting board and encapsulates the light emitting diode element is further included.

A method for producing an element-connecting board of the present invention includes the steps of preparing a lead frame provided with a plurality of leads disposed with spaces from each other and a joint connecting a plurality of the leads, allowing a first insulating resin portion which is light reflective to fill the spaces, and cutting off the joint.

In the element-connecting board of the present invention obtained by the method for producing an element-connecting board of the present invention, the first insulating resin portion fills the spaces of the lead frame, so that both of one surface in the thickness direction of the lead frame and one surface in the thickness direction of the first insulating resin portion can be exposed.

Therefore, when the light emitting diode element is connected to one side in the thickness direction of the lead frame, thereafter, the light emitting diode element is easily and surely covered with the encapsulating sheet, so that the light emitting diode element can be easily and surely encapsulated.

The first insulating resin portion has light reflectivity, so that the element-connecting board of the present invention has an excellent light reflectivity. Therefore, in the light emitting diode device including the element-connecting board of the present invention, light emitted from the light emitting diode element can be reflected, so that the luminous efficiency can be improved.

In addition, in the element-connecting board of the present invention, the first insulating resin portion fills the spaces separating a plurality of the leads, so that a plurality of the leads can be surely supported.

In the light emitting diode device of the present invention, the light emitting diode element connected to the element-connecting board can be easily and surely encapsulated by the above-described encapsulating sheet. Therefore, the reliability of the light emitting diode device can be easily and surely improved.

In the method for producing an element-connecting board of the present invention, the shape of the lead frame in which a plurality of the leads are connected by the joint is maintained, and the first insulating resin portion surely fills the spaces of the lead frame and a plurality of the leads can be surely supported.

By cutting off the joint, a desired circuit consisting of a plurality of the leads can be formed.

BRIEF DESCRIPTION OF THE DRAWINGS

FIG. 1 shows one embodiment of an element-connecting board of the present invention:
(a) illustrating a plan view and
(b) illustrating a front sectional view along the A-A line.

FIG. 2 shows a lead frame with a joint used in a method for producing the element-connecting board shown in FIG. 1:
(a) illustrating a plan view and
(b) illustrating a front sectional view along the B-B line.

FIG. 3 shows a lead frame with a joint used in a method for producing the element-connecting board shown in FIG. 1 and having spaces filled with a first insulating resin portion:
(a) illustrating a plan view and
(b) illustrating a front sectional view along the C-C line.

FIG. 8 shows another embodiment of an element-connecting board of the present invention:
(a) illustrating a plan view and
(b) illustrating a front sectional view along the E-E line.

FIG. 9 shows a lead frame used in a method for producing the element-connecting board shown in FIG. 8:
(a) illustrating a plan view and
(b) illustrating a front sectional view along the F-F line.

FIG. 10 shows another embodiment of a light emitting diode device of the present invention:
(a) illustrating a plan view and
(b) illustrating a front sectional view along the G-G line.

FIG. 11 shows an embodiment of dividing the element-connecting board shown in FIG. 8 into two pieces:
(a) illustrating a plan view of the element-connecting board shown by a cutting plane line and
(b) illustrating a plan view of the element-connecting board divided into two pieces.

DETAILED DESCRIPTION OF THE INVENTION

Figure 4:
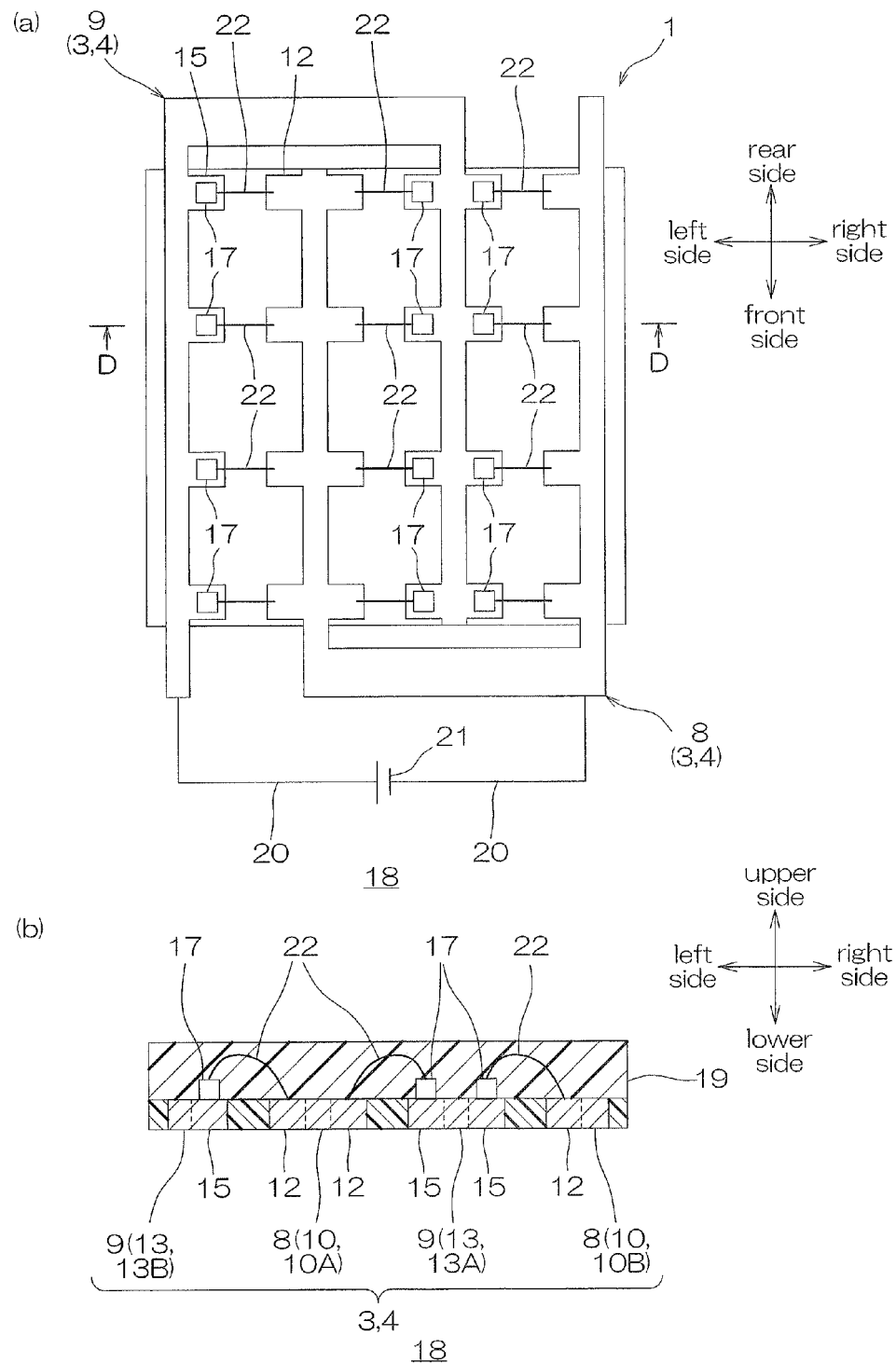
FIG. 4 shows one embodiment of a light emitting diode device of the present invention:
(a) illustrating a plan view and
(b) illustrating a front sectional view along the D-D line.

FIG. 1 shows one embodiment of an element-connecting board of the present invention. FIG. 2 shows a lead frame with a joint used in a method for producing the element-connecting board shown in FIG. 1. FIG. 3 shows a lead frame with a joint used in a method for producing the element-connecting board shown in FIG. 1 and having spaces filled with a first insulating resin portion.

Regarding an element-connecting board 1, when referred to direction, a direction arrow shown in each of the drawings is defined as a reference.

In FIGS. 1 (a) and 1 (b), the element-connecting board 1 is formed into a generally rectangular flat plate shape in plane view.

The element-connecting board 1 includes a lead frame 4 which is provided with a plurality of leads 3 disposed with spaces 2 from each other (ref: FIGS. 2 (a) and 2 (b)) and a first insulating resin portion 5 which is light reflective and fills the spaces 2. Second insulating resin portions 6 are provided on the side surfaces of the element-connecting board 1.

The lead frame 4 is an electrically-conductive member for allowing light emitting diode elements 17 (ref: FIGS. 4 (a) and 4 (b)) to be described later to be connected to the upper surface (one surface in the thickness direction) thereof.

An example of a material which forms the lead frame 4 includes an electrically-conductive material such as copper, nickel, gold, and 42 alloy.

A plurality of the leads 3 are defined by the spaces 2 extending along the front-rear direction (a direction perpendicular to the thickness direction, hereinafter the same). That is, a plurality of the leads 3 are formed into generally rectangular shapes in plane view extending in the front-rear direction and are disposed in alignment at spaced intervals to each other in the widthwise direction (the right-left direction).

To be specific, a plurality of the leads 3 include a first lead 8 and a second lead 9 which is adjacent to the first lead 8 in the widthwise direction.

The first lead 8 is formed into a generally U-shaped shape in plane view which is open toward the rear side. To be specific, the first lead 8 integrally includes a plurality (two pieces) of first linear portions 10 which are disposed in alignment at spaced intervals to each other in the widthwise direction and a first connecting portion 11 which connects the front end portions (one end portions) of the first linear portions 10.

Two pieces of the first linear portions 10 are formed into generally flat plate shapes extending in parallel in the front-rear direction.

A first linear portion 10B at the right side, when projected in the widthwise direction, slightly protrudes toward the front side with respect to a first linear portion 10A at the left side.

In the first linear portion 10A at the left side, first pads 12 which protrude from the both end surfaces in the widthwise direction partway in the front-rear direction thereof toward the both sides in the widthwise direction are provided. In the first linear portion 10B at the right side, the first pads 12 which protrude from the left end surface partway in the front-rear direction thereof toward the left side are provided.

The first pads 12 are disposed in alignment at spaced intervals to each other in the front-rear direction. Each of the first pads 12 is formed into a generally rectangular shape in plane view extending in the widthwise direction.

The first connecting portion 11 is disposed at the front end portion of the element-connecting board 1 and is formed into a generally rectangular shape in plane view extending in the right-left direction.

The second lead 9 is formed into a point-symmetric shape obtained by rotating 180 degrees around the first lead 8 on the element-connecting board 1. To be specific, the second lead 9 is formed into a generally U-shaped shape in plane view which is open toward the front side. The second lead 9 integrally forms a plurality (two pieces) of second linear portions 13 which are disposed in alignment at spaced intervals to each other in the widthwise direction and a second connecting portion 14 which connects the rear end portions (the other end portions) of the second linear portions 13.

Two pieces of the second linear portions 13 are formed into generally flat plate shapes extending in parallel in the front-rear direction. A second linear portion 13B at the left side, when projected in the widthwise direction, slightly protrudes toward the front side with respect to a second linear portion 13A at the right side. In the second linear portion 13A at the right side, second pads 15 which protrude from the both end surfaces in the widthwise direction partway in the front-rear direction thereof toward the both sides in the widthwise direction are provided. In the second linear portion 13A at the left side, the second pads 15 which protrude from the right end surface partway in the front-rear direction thereof toward the right side are provided.

The second pads 15 are disposed in alignment at spaced intervals to each other in the front-rear direction. Each of the second pads 15 is formed into a generally rectangular shape in plane view extending in the widthwise direction.

The second connecting portion 14 is disposed at the rear end portion of the element-connecting board 1 and is formed into a generally rectangular shape in plane view extending in the right-left direction.

The first lead 8 and the second lead 9 are disposed in such a way that the first linear portions 10 and the second linear portions 13 are spaced in opposed relation to each other in the widthwise direction. To be specific, two pieces of the first linear portions 10 and two pieces of the second linear portions 13 are alternately (by turns) arranged from the right side toward the left side. To be more specific, the first lead 8 and the second lead 9 are disposed so that each of the first linear portions 10 and each of the second linear portions 13 are alternately meshed (fitted) with each other with the spaces 2 therebetween. In this way, the first pads 12 and the second pads 15 are disposed in opposed relation to each other with spaces 2 therebetween in the widthwise direction.

The first linear portion 10A at the left side in the first lead 8 and the second connecting portion 14 in the second lead 9 are disposed with the space 2 therebetween in the front-rear direction. The second linear portion 13A at the right side in the second lead 9 and the first connecting portion 11 in the first lead 8 are disposed with the space 2 therebetween in the front-rear direction.

The size of the lead frame 4 and the spaces 2 are appropriately selected in accordance with its use and purpose. A thickness T1 of the lead frame 4 is, for example, 35 to 2000 μm, or preferably 200 to 1000 μm. A width L1 of each of the first linear portions 10 and each of the second linear portions 13 is, for example, 300 to 1800 μm, or preferably 800 to 1200 μm. A length L2 in the front-rear direction of each of the first pads 12 and each of the second pads 15 is, for example, 500 to 3500 μm, or preferably 1000 to 3000 μm. A width L3 of each of the first pads 12 and each of the second pads 15 is, for example, 1000 to 5000 μm, or preferably 3500 to 4500 μm. A gap L4 in the front-rear direction between the first pads 12 and the gap L4 in the front-rear direction between the second pads 15 are, for example, 3000 to 9000 μm, or preferably 5000 to 7000 μm.

A length L5 in the widthwise direction of the first connecting portion 11 and the second connecting portion 14 and the length L7 in the front-rear direction of the first connecting portion 11 and the second connecting portion 14 are, for example, 15000 to 27000 μm, or preferably 18000 to 24000 μm.

A width (a length in the widthwise direction) L8 of the space 2 between the first pad 12 and the second pad 15 which are opposed to each other in the widthwise direction is, for example, 50 to 1000 μm, or preferably 100 to 400 μm. A width (a length in the widthwise direction) L9 of the space 2 between the portion of each of the first linear portions 10 between the first pads 12 adjacent to each other in the front-rear direction and the portion of each of the second linear portions 13 between the second pads 15 adjacent to each other in the front-rear direction is, for example, 500 to 8000 μm, or preferably 1000 to 4000 μm.

The first insulating resin portion 5 is, for example, in view of obtaining light reflectivity, formed from a reflecting resin composition.

The reflecting resin composition contains, for example, an encapsulating resin composition and a light reflecting component.

Examples of the encapsulating resin composition include a silicone resin composition and an epoxy resin composition.

The silicone resin composition is a condensation and addition reaction curable type silicone resin composition which can undergo a condensation reaction and an addition reaction (to be specific, a hydrosilylation reaction). To be more specific, the silicone resin composition can be brought into a semi-cured (B-stage) state by undergoing the condensation reaction by heating and then, be brought into a cured (completely cured) state by undergoing the addition reaction by further heating.

The silicone resin composition contains, for example, a polysiloxane containing silanol groups at both ends, an ethylenic silicon compound, a silicon compound containing an epoxy group, an organohydrogensiloxane, a condensation catalyst, and an addition catalyst.

The polysiloxane containing silanol groups at both ends, the ethylenic silicon compound, and the silicon compound containing an epoxy group are condensation materials (materials subjected to the condensation reaction) and the ethylenic silicon compound and the organohydrogensiloxane are addition materials (materials subjected to the addition reaction).

The polysiloxane containing silanol groups at both ends is an organosiloxane which contains silanol groups (SiOH groups) at both ends of a molecule and to be specific, is represented by the following general formula (1).

General Formula (1):

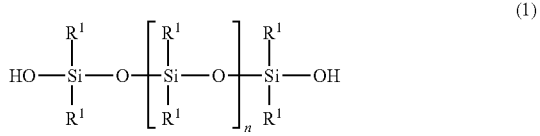

(where, in general formula (1), $R^1$ represents a monovalent hydrocarbon group selected from a saturated hydrocarbon group and an aromatic hydrocarbon group. "n" represents an integer of 1 or more.)

In the above-described general formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (1), in the monovalent hydrocarbon group represented by $R^1$, an example of the aromatic hydrocarbon group includes an aryl group having 6 to 10 carbon atoms (such as a phenyl group and a naphthyl group).

In the above-described general formula (1), $R^1$s may be the same or different from each other. Preferably, $R^1$s are the same.

As the monovalent hydrocarbon group, preferably, an alkyl group having 1 to 6 carbon atoms and an aryl group having 6 to 10 carbon atoms are used, or more preferably, in view of transparency, heat resistance, and light resistance, a methyl group is used.

In the above-described general formula (1), "n" is preferably, in view of stability and/or handling ability, an integer of 1 to 10,000, or more preferably an integer of 1 to 1,000.

"n" in the above-described general formula (1) is calculated as an average value.

To be specific, examples of the polysiloxane containing silanol groups at both ends include polydimethylsiloxane containing silanol groups at both ends, polymethylphenylsiloxane containing silanol groups at both ends, and polydiphenylsiloxane containing silanol groups at both ends.

These polysiloxanes containing silanol groups at both ends can be used alone or in combination.

Of the polysiloxanes containing silanol groups at both ends, preferably, polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

The number average molecular weight of the polysiloxane containing silanol groups at both ends is, in view of stability and/or handling ability, for example, 100 to 1,000,000, or preferably 200 to 100,000. The number average molecular weight is calculated by conversion based on standard polystyrene with a gel permeation chromatography. The number average molecular weight of materials, other than the polysiloxane containing silanol groups at both ends, to be described later, is also calculated in the same manner as described above.

The content of the silanol group in the polysiloxane containing silanol groups at both ends is, for example, 0.002 to 25 mmol/g, or preferably 0.02 to 25 mmol/g. The content of the silanol group is calculated from the integral proportion of the peaks of the silanol group and the methyl group with a $^1$H-NMR.

The mixing ratio of the polysiloxane containing silanol groups at both ends with respect to 100 parts by mass of the condensation material is, for example, 1 to 99.99 parts by mass, preferably 50 to 99.9 parts by mass, or more preferably 80 to 99.5 parts by mass.

The ethylenic silicon compound is a silane compound having both an ethylenically unsaturated hydrocarbon group and a leaving group in a silanol condensation reaction and to be specific, is represented by the following general formula (2).

General Formula (2):

$$R^2\text{—}Si(X^1)_3 \tag{2}$$

(where, in general formula (2), $R^2$ represents a monovalent ethylenically unsaturated hydrocarbon group. $X^1$ represents a halogen atom, an alkoxy group, a phenoxy group, or an acetoxy group. $X^1$s may be the same or different from each other.)

In the above-described general formula (2), an example of the ethylenically unsaturated hydrocarbon group represented by $R^2$ includes a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with a hydrosilyl group in the organohydrogensiloxane, preferably, an alkenyl group is used, more preferably, an alkenyl group having 2 to 5 carbon atoms is used, or particularly preferably, a vinyl group is used.

$X^1$ in the above-described general formula (2) is a leaving group in the silanol condensation reaction. $SiX^1$ group in the above-described general formula (2) is a reactive functional group in the silanol condensation reaction.

In the above-described general formula (2), examples of a halogen atom represented by $X^1$ include bromine, chlorine, fluorine, and iodine.

In the above-described general formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described general formula (2), $X^1$s may be the same or different from each other. Preferably, $X^1$s are the same.

Of the $X^1$s in the above-described general formula (2), preferably, an alkoxy group is used, or more preferably, a methoxy group is used.

Examples of the ethylenic silicon compound include a trialkoxysilane containing an ethylenically unsaturated hydrocarbon group, a trihalogenated silane containing an ethylenically unsaturated hydrocarbon group, a triphenoxysilane containing an ethylenically unsaturated hydrocarbon group, and a triacetoxysilane containing an ethylenically unsaturated hydrocarbon group.

These ethylenic silicon compounds can be used alone or in combination.

Of the ethylenic silicon compounds, preferably, a trialkoxysilane containing an ethylenically unsaturated hydrocarbon group is used.

To be specific, examples of the trialkoxysilane containing an ethylenically unsaturated hydrocarbon group include vinyltrialkoxysilane such as vinyltrimethoxysilane, vinyltriethoxysilane, and vinyltripropoxysilane; allyltrialkoxysilane such as allyltrimethoxysilane; propenyltrialkoxysilane such as propenyltrimethoxysilane; butenyltrialkoxysilane such as butenyltrimethoxysilane; and cyclohexenyltrialkoxysilane such as cyclohexenyltrimethoxysilane.

Of the trialkoxysilanes containing an ethylenically unsaturated hydrocarbon group, preferably, vinyltrialkoxysilane is used, or more preferably, vinyltrimethoxysilane is used.

The mixing ratio of the ethylenic silicon compound with respect to 100 parts by mass of the condensation material is, for example, 0.01 to 90 parts by mass, preferably 0.01 to 50 parts by mass, or more preferably 0.01 to 10 parts by mass.

A commercially available product can be used as the ethylenic silicon compound. An ethylenic silicon compound synthesized in accordance with a known method can be also used.

The silicon compound containing an epoxy group is a silane compound having both an epoxy group and a leaving group in the silanol condensation reaction and to be specific, is represented by the following general formula (3).

General Formula (3):

(where, in general formula (3), $R^3$ represents a group having an epoxy structure. $X^2$ represents a halogen atom, an alkoxy group, a phenoxy group, or an acetoxy group. $X^2$s may be the same or different from each other.)

In the above-described general formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably, a glycidyl ether group is used. To be specific, the glycidyl ether group is a glycidoxyalkyl group represented by the following general formula (4).

General Formula (4):

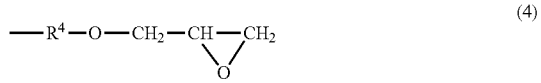

(where, in general formula (4), $R^4$ represents a divalent hydrocarbon group selected from a saturated hydrocarbon group and an aromatic hydrocarbon group.)

In the above-described general formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described general formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably, a glycidoxypropyl group is used.

$X^2$ in the above-described general formula (3) is a leaving group in the silanol condensation reaction. $SiX^2$ group in the above-described general formula (3) is a reactive functional group in the silanol condensation reaction.

In the above-described general formula (3), an example of the halogen atom represented by $X^2$ includes the same halogen atom as that represented by $X^1$ in the above-described general formula (2).

In the above-described general formula (3), an example of the alkoxy group represented by $X^2$ includes the same alkoxy group as that represented by $X^1$ in the above-described general formula (2).

In the above-described general formula (3), $X^2$s may be the same or different from each other. Preferably, $X^2$s are the same.

As $X^2$ in the above-described general formula (3), preferably, an alkoxy group is used, or more preferably, a methoxy group is used.

Examples of the silicon compound containing an epoxy group include a trialkoxysilane containing an epoxy group, a trihalogenated silane containing an epoxy group, a triphenoxysilane containing an epoxy group, and a triacetoxysilane containing an epoxy group.

The silicon compounds containing an epoxy group can be used alone or in combination.

Of the ethylenic silicon compounds, preferably, a trialkoxysilane containing an epoxy group is used.

To be specific, examples of the trialkoxysilane containing an epoxy group include glycidoxyalkyltrimethoxysilane such as glycidoxymethyltrimethoxysilane, (2-glycidoxyethyl)trimethoxysilane, and (3-glycidoxypropyl)trimethoxysilane; glycidoxyalkyltriethoxysilane such as (3-glycidoxypropyl) triethoxysilane; glycidoxyalkyltripropoxysilane such as (3-glycidoxypropyl)tripropoxysilane; and glycidoxyalkyltriisopropoxysilane such as (3-glycidoxypropyl)triisopropoxysilane.

Of the trialkoxysilanes containing an epoxy group, preferably, glycidoxymethyltrialkoxysilane is used, or more preferably, (3-glycidoxypropyl)trimethoxysilane is used.

The mixing ratio of the silicon compound containing an epoxy group with respect to 100 parts by mass of the condensation material is, for example, 0.01 to 90 parts by mass, preferably 0.01 to 50 parts by mass, or more preferably 0.01 to 1 parts by mass.

A commercially available product can be used as the silicon compound containing an epoxy group. A silicon compound containing an epoxy group synthesized in accordance with a known method can be also used.

The molar ratio ($SiOH/(SiX^1+SiX^2)$) of the silanol group (the SiOH group) in the polysiloxane containing silanol groups at both ends to the reactive functional group (the $SiX^1$ group and the $SiX^2$ group) in the ethylenic silicon compound and the silicon compound containing an epoxy group is, for example, 20/1 to 0.2/1, preferably 10/1 to 0.5/1, or more preferably substantially 1/1.

When the molar ratio exceeds the above-described range, there may be a case where a product in a semi-cured state (a semi-cured product) having an appropriate toughness is not obtained when the silicone resin composition is brought into a semi-cured state. On the other hand, when the molar ratio is below the above-described range, the mixing proportion of the ethylenic silicon compound and the silicon compound containing an epoxy group is excessively large, so that the heat resistance of the first insulating resin portion 5 may be reduced.

When the molar ratio is within the above-described range (preferably, substantially 1/1), the silanol group (the SiOH group) in the polysiloxane containing silanol groups at both ends, and the reactive functional group (the $SiX^1$ group) in the ethylenic silicon compound and the reactive functional group (the $SiX^2$ group) in the silicon compound containing an epoxy group can be allowed to undergo the condensation reaction neither too much nor too little.

The molar ratio of the ethylenic silicon compound to the silicon compound containing an epoxy group is, for example, 10/90 to 99/1, preferably 50/50 to 97/3, or more preferably 80/20 to 95/5.

When the molar ratio is within the above-described range, there is an advantage that the adhesiveness of a cured product can be improved, while the strength thereof is ensured.

The organohydrogensiloxane is an organosiloxane having, in one molecule, at least two hydrosilyl groups (the SiH groups) without containing an ethylenically unsaturated hydrocarbon group.

To be specific, an example of the organohydrogensiloxane includes an organopolysiloxane such as an organopolysiloxane containing hydrogen atoms in its side chain and an organopolysiloxane containing hydrogen atoms at both ends.

The organopolysiloxane containing hydrogen atoms in its side chain is an organohydrogenpolysiloxane having hydrogen atoms as a side chain which branches off from the main chain and is represented by formula (5).

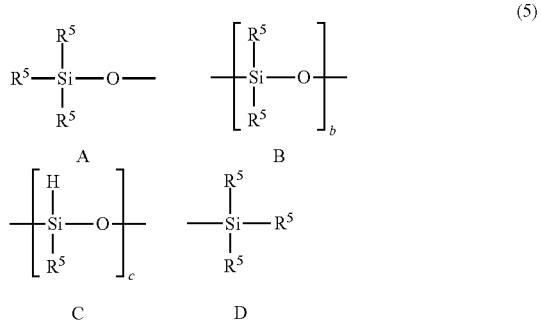

(where, in formula, A to D represent a constituent unit, A and D represent an end unit, and B and C represent a repeating unit. $R^5$ represents a monovalent hydrocarbon group selected from a saturated hydrocarbon group and an aromatic hydrocarbon group. "b" represents an integer of 0 or more and "c" represents an integer of 1 or more.)

A to D constitute an organopolysiloxane containing a hydrogen atom in its side chain.

The monovalent hydrocarbon groups represented by $R^5$ in formula (5) may be the same or different from each other. Preferably, the monovalent hydrocarbon groups represented by $R^5$ are the same.

In the monovalent hydrocarbon group represented by $R^5$, examples of the saturated hydrocarbon group and the aromatic hydrocarbon group include the same saturated hydrocarbon group and aromatic hydrocarbon group as those illustrated by $R^1$ in the above-described general formula (1). As the monovalent hydrocarbon group, preferably, methyl and phenyl are used, or more preferably, methyl is used.

"b" is preferably, in view of reactivity and stability, an integer of 1 to 10,000, more preferably an integer of 2 to 5,000, or particularly preferably an integer of 5 to 100.

"c" is preferably 2 or more, in view of reactivity and stability, preferably an integer of 1 to 10,000, more preferably an integer of 2 to 1,000, or particularly preferably an integer of 5 to 100.

Examples of the organopolysiloxane containing hydrogen atoms in its side chain include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane.

The number average molecular weight of the organopolysiloxane containing hydrogen atoms in its side chain is, for example, 100 to 1,000,000.

The organopolysiloxane containing hydrogen atoms at both ends is an organohydrogenpolysiloxane having hydrogen atoms at both ends of the main chain and is represented by formula (6).

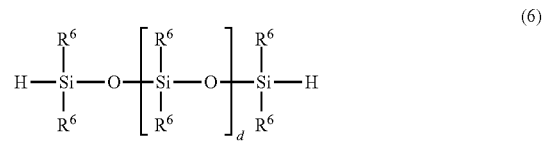

(where, in formula, $R^6$ represents a monovalent hydrocarbon group selected from a saturated hydrocarbon group and an aromatic hydrocarbon group. "d" represents an integer of 1 or more.)

In the monovalent hydrocarbon group represented by $R^6$, examples of the saturated hydrocarbon group and the aromatic hydrocarbon group include the same saturated hydrocarbon group and aromatic hydrocarbon group as those illustrated by $R^1$ in the above-described general formula (1). As the monovalent hydrocarbon group, preferably, methyl and phenyl are used, or more preferably, methyl is used.

"d" is preferably, in view of reactivity and stability, an integer of 1 to 10,000, or more preferably an integer of 1 to 5,000.

Examples of the organopolysiloxane containing hydrogen atoms at both ends include polydimethylsiloxane containing hydrosilyl groups at both ends, polymethylphenylsiloxane containing hydrosilyl groups at both ends, and polydiphenylsiloxane containing hydrosilyl groups at both ends.

The number average molecular weight of the organopolysiloxane containing hydrogen atoms at both ends is, for example, in view of stability and/or handling ability, 100 to 1,000,000, or preferably 100 to 100,000.

These organohydrogensiloxanes can be used alone or in combination.

Of the organohydrogensiloxanes, preferably, an organopolysiloxane containing hydrogen atoms in its side chain is used, or more preferably, dimethylpolysiloxane-co-methylhydrogenpolysiloxane is used.

The viscosity of the organohydrogensiloxane at 25° C. is, for example, 10 to 100,000 mPa·s, or preferably 20 to 50,000 mPa·s. The viscosity is measured using a B-type viscometer.

The content of the hydrosilyl group in the organohydrogensiloxane is, for example, 0.1 to 15 mmol/g, or preferably 0.5 to 10 mmol/g. The content of the hydrosilyl group is calculated from the integral proportion of the peaks of the hydrosilyl group and the methyl group with a $^1$H-NMR.

A commercially available product can be used as the organohydrogensiloxane. An organohydrogensiloxane synthesized in accordance with a known method can be also used.

The mixing ratio of the organohydrogensiloxane with respect to 100 parts by mass of the ethylenic silicon compound is, though depending on the molar ratio of the ethylenically unsaturated hydrocarbon group ($R^2$ in the above-described general formula (2)) in the ethylenic silicon compound to the hydrosilyl group (the SiH group) in the organohydrogensiloxane, for example, 10 to 10,000 parts by mass, or preferably 100 to 1,000 parts by mass.

The molar ratio ($R^2$/SiH) of the ethylenically unsaturated hydrocarbon group ($R^2$ in the above-described general formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can be also set to be, for example, less than 1/1 and not less than 0.05/1.

When the molar ratio exceeds 20/1, there may be a case where a semi-cured product having an appropriate toughness is not obtained when the silicone resin composition is brought into a semi-cured state. On the other hand, when the molar ratio is below 0.05/1, the mixing proportion of the organohydrogensiloxane is excessively large, so that the heat resistance and the toughness of the first insulating resin portion 5 may be insufficient.

When the molar ratio is less than 1/1 and not less than 0.05/1, in allowing the silicone resin composition to be in a semi-cured state, the silicone resin composition can be quickly transferred into a semi-cured state with respect to the silicone resin composition whose molar ratio is 20/1 to 1/1.

The condensation catalyst is not particularly limited as long as it is a substance capable of improving the reaction rate of the condensation reaction of the silanol group and the reactive functional group (the $SiX^1$ group in the above-described general formula (2) and the $SiX^2$ group in the above-described general formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

These condensation catalysts can be used alone or in combination.

Of the condensation catalysts, in view of compatibility and thermal decomposition characteristics, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.25 to 5 mol.

The addition catalyst is not particularly limited as long as it is a substance (a hydrosilylation catalyst) capable of improving the reaction rate of the addition reaction, that is, the hydrosilylation reaction of the ethylenically unsaturated hydrocarbon group and the hydrosilyl group (the SiH group) and a metal catalyst is, for example, used. Examples of the metal catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

Of the addition catalysts, in view of compatibility and transparency, preferably, a platinum catalyst is used, or more preferably, a platinum olefin complex is used. To be specific, a platinum-divinylsiloxane complex such as a platinum-1,3-divinyl-1,1,3,3-tetramethyldisiloxane complex is used.

These addition catalysts can be used alone or in combination.

Of the addition catalysts, in view of compatibility, transparency, and catalyst activity, preferably, a platinum catalyst is used, or more preferably, a platinum-carbonyl complex is used.

The mixing ratio of the addition catalyst with respect to 100 parts by mass of the organohydrogensiloxane is, as a number of parts by mass of the metal amount in the addition catalyst, for example $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass.

As the above-described condensation catalyst and addition catalyst, a condensation catalyst and an addition catalyst in a solid state can be used as they are. Alternatively, in view of handling ability, a condensation catalyst and an addition catalyst can be used as a solution or as a dispersion liquid dissolved or dispersed in a solvent.

Examples of the solvent include water; an alcohol such as methanol and ethanol; and an aromatic hydrocarbon such as toluene.

A polysiloxane containing silanol groups at both ends, an ethylenic silicon compound, a silicon compound containing an epoxy group, an organohydrogensiloxane, a condensation catalyst, and an addition catalyst are blended to be stirred and mixed, so that the silicone resin composition is prepared.

In order to prepare the silicone resin composition, for example, the above-described materials (the condensation materials and the addition materials) and the catalysts can be blended simultaneously. Alternatively, each of the materials and each of the catalysts can be blended, respectively, at different timings. Furthermore, a part of the components can be added simultaneously and each of the remaining components can be blended, respectively, at different timings.

Of the preparing methods of the silicone resin composition, preferably the following method is used. The condensation materials are first prepared and then, the condensation catalyst is blended into the prepared condensation materials to prepare a mixture. Next, the addition material is blended into the prepared mixture and then, the addition catalyst is blended thereto.

To be specific, after stirring and mixing the polysiloxane containing silanol groups at both ends, the ethylenic silicon compound, and the silicon compound containing an epoxy group (that is, the condensation materials) at the above-described proportion, the condensation catalyst is blended thereto to be stirred and mixed for, for example, 5 minutes to 24 hours, so that a mixture is prepared.

At the time of blending and stirring, the temperature can be also adjusted to be, for example, 0 to 60° C. so as to improve the compatibility and the handling ability of the condensation materials.

By the above-described mixing, the condensation reaction of the SiOH group in the polysiloxane containing silanol groups at both ends, and the $SiX^1$ group in the ethylenic silicon compound and the $SiX^2$ group in the silicon compound containing an epoxy group may be partially initiated. The degree of progress of the condensation reaction can be checked by $^1$H-NMR measurement based on the disappearance degree of the peak derived from the SiOH group.

Thereafter, the pressure in the system is reduced as required, so that a volatile component (a solvent and the like) is removed.

Next, the organohydrogensiloxane is blended into the prepared mixture of the condensation materials and the condensation catalyst to be stirred for, for example, 1 to 120 minutes.

At the time of blending and stirring, the temperature can be also adjusted to be, for example, 0 to 60° C. so as to improve the compatibility and the handling ability of the mixture and the organohydrogensiloxane.

Thereafter, the addition catalyst is blended into the system (the above-described mixture) to be stirred for, for example, 1 to 60 minutes.

In this way, the silicone resin composition is prepared.

The silicone resin composition is, for example, in a liquid state (in an oil state). Although described later, after the preparation thereof, the silicone resin composition is prepared as an encapsulating resin composition by blending a light reflecting component and the like thereto. Thereafter, the encapsulating resin composition in a liquid state or in a semi-solid state fills the spaces 2. Then, the encapsulating resin composition is heated, so that the condensation materials are subjected to a condensation reaction to be brought into a B-stage state (a semi-cured state). Thereafter, by further heating, the addition material is subjected to an addition reaction to be brought into a C-stage state (a completely cured state).

The epoxy resin composition is a resin composition which is capable of thermally curing by heating.

The epoxy resin composition is not particularly limited. Examples thereof include a thermosetting resin which contains an epoxy resin, a curing agent, and a curing accelerator described in Japanese Unexamined Patent Publication No. 2011-119393 and an insulating resin layer forming material which contains an epoxy resin and an acid anhydride curing agent described in Japanese Unexamined Patent Publication No. 2011-60819.

The mixing proportion of the epoxy resin, the curing agent, and the curing accelerator in the thermosetting resin is set in conformity with, for example, the description in Japanese Unexamined Patent Publication No. 2011-119393. The mixing proportion of the epoxy resin and the acid anhydride curing agent in the insulating resin layer forming material is set in conformity with, for example, the description in Japanese Unexamined Patent Publication No. 2011-60819.

The content ratio of the encapsulating resin compositions with respect to the reflecting resin composition is, for example, 10 to 99.5 mass %, preferably, in view of coloring characteristics and handling ability of the reflecting resin composition, 30 to 98.5 mass %, or more preferably 40 to 60 mass %.

These encapsulating resin compositions can be used alone or in combination.

As the encapsulating resin composition, preferably, a silicone resin composition is used.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (lead carbonate) and calcium carbonate; and a clay mineral such as kaolin (kaolinite).

As the white inorganic pigment, preferably, an oxide is used, or more preferably, titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. Examples of the crystal structure thereof include a rutile type, a brookite type (pyromelane), and an anatase type (octahedrite). Preferably, a rutile type is used.

A crystal system of the titanium oxide is not particularly limited. Examples of the crystal system thereof include a tetragonal system and an orthorhombic system. Preferably, a tetragonal system is used.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where the first insulating resin portion 5 is exposed to a high temperature for a long time.

The light reflecting component is in the form of a particle. The shape thereof is not limited and examples of the shape thereof include a sphere shape, a plate shape, and a needle shape. An average value of the maximum length (in the case of the sphere shape, the average particle size) of the light reflecting component is in the range of, for example, 1 to 1,000 nm, or preferably 100 to 500 nm. The average value of the maximum length is measured by using a laser diffraction scattering particle size analyzer.

The content ratio of the light reflecting component with respect to the reflecting resin composition is, for example, 0.5 to 90 mass %, preferably, in view of coloring characteristics and light reflectivity, and handling ability of the reflecting resin composition, 1.5 to 70 mass %, more preferably 10 to 40 mass %, or particularly preferably 25 to 35 mass %.

The mixing ratio of the light reflecting component with respect to 100 parts by mass of the encapsulating resin composition is, for example, 2 to 200 parts by mass, preferably 10 to 90 parts by mass, or more preferably 25 to 75 parts by mass.

The encapsulating resin composition and the light reflecting component are blended to be uniformly mixed, so that the reflecting resin composition is prepared.

In this way, the light reflecting component is uniformly dispersed and mixed into the encapsulating resin composition.

The reflecting resin composition can further contain an inorganic filler.

Examples of the inorganic filler include silica (silicon dioxide), barium sulfate, barium carbonate, barium titanate, magnesium oxide, iron oxide, aluminum hydroxide, calcium carbonate, layered mica, carbon black, diatomite, and glass fiber.

These inorganic fillers can be used alone or in combination.

Of the inorganic fillers, preferably silica (silicon dioxide) is used.

The inorganic filler is in the form of a particle. The shape thereof is not limited and examples of the shape thereof include a sphere shape, a plate shape, and a needle shape. An average value of the maximum length (in the case of the sphere shape, the average particle size) of the inorganic filler is in the range of, for example, 1 to 1,000 nm, or preferably 100 to 500 nm. The average value of the maximum length is measured by using a laser diffraction scattering particle size analyzer.

The average particle size of the inorganic filler is in the range of, for example, 1 to 1,000 μm, or preferably 10 to 100 μm. The average value of the maximum length is measured by using a laser diffraction scattering particle size analyzer.

The content ratio of the inorganic filler with respect to the reflecting resin composition is, for example, 1 to 50 mass %, preferably, 5 to 40 mass %, or more preferably 15 to 30 mass %.

When the inorganic filler is blended into the reflecting resin composition, the total number of parts by mass of the light reflecting component and the inorganic filler with respect to 100 parts by mass of the encapsulating resin composition is, for example, 50 to 300 parts by mass, or preferably 100 to 200 parts by mass. Furthermore, the mass ratio (mass of light reflecting component/(mass of light reflecting component+ mass of inorganic filler)) of the light reflecting component with respect to the total number of parts by mass of the light reflecting component and the inorganic filler is, for example, 0.0001 to 1, or preferably 0.01 to 1.

The mass ratio (mass of light reflecting component/mass of inorganic filler) of the light reflecting component with respect to the inorganic filler is, for example, 0.2 to 3.0, or preferably 0.5 to 2.0. Among all, when the encapsulating resin composition is the epoxy resin composition, the mass ratio (mass of light reflecting component/mass of inorganic filler) of the light reflecting component with respect to the inorganic filler is, for example, 0.26 to 3.0.

The above-described inorganic filler is uniformly dispersed and mixed into the encapsulating resin composition together with the light reflecting component.

The reflecting resin composition prepared in this way is prepared in a liquid state or in a semi-solid state.

The first insulating resin portion 5 is formed so that all of the upper surfaces and the lower surfaces of a plurality of the leads 3 are exposed.

To be specific, the first insulating resin portion 5 fills the spaces 2 which are defined in the widthwise direction by the first pads 12 and the second pads 15 that are opposed to each other in the widthwise direction. The first insulating resin portion 5 also fills the spaces 2 which are defined in the widthwise direction by the first linear portions 10 between each of the first pads 12 that are adjacent to each other in the front-rear direction and by the second linear portions 13 between each of the second pads 15 that are adjacent to each other in the front-rear direction.

On the other hand, the first insulating resin portion 5 does not fill the space 2 defined by the first connecting portion 11 of the first lead 8, and the first pads 12 and the second pads 15 which are disposed in opposed relation to each other at the rear side of the first connecting portion 11. Such a space 2 is defined as an empty space. The first insulating resin portion 5 also does not fill the space 2 defined by the second connecting portion 14 of the second lead 9, and the first pads 12 and the second pads 15 which are disposed in opposed relation to each other at the front side of the second connecting portion 14. Such a space 2 is defined as an empty space.

A thickness T2 of the first insulating resin portion 5 is substantially the same as the thickness T1 of the lead frame 4.

The second insulating resin portion 6 is formed from, for example, the same reflecting resin composition as that of the first insulating resin portion 5. The second insulating resin portion 6 can be also formed from, for example, an acrylic resin, a polyimide resin, or the like. In view of reducing the number of steps of the production process, preferably, the second insulating resin portion 6 is formed from the same reflecting resin composition as that of the first insulating resin portion 5.

The second insulating resin portions 6 are formed into generally flat plate shapes in plane view extending in the front-rear direction. To be specific, each of the second insulating resin portions 6 is formed along the right side surface of the first linear portion 10A at the right side of the first lead 8 and is also formed along the left side surface of the second linear portion 13B at the left side of the second lead 9.

A thickness T3 of each of the second insulating resin portions 6 is substantially the same as the thickness T1 of the lead frame 4.

In this way, the lead frame 4, the first insulating resin portion 5, and the second insulating resin portions 6 are formed to be flush with each other on the upper surfaces and the lower surfaces.

Next, a method for producing the element-connecting board 1 is described.

First, in this method, as shown in FIGS. 2 (a) and 2 (b), as a lead frame, a lead frame 4' with a joint in which a plurality of the leads 3 are connected by a joint 16 is prepared.

That is, the lead frame 4' with a joint is integrally provided with the above-described plurality of the leads 3 and the joint 16 which connect a plurality of the leads 3.

The joint 16 connects the first lead 8 and the second lead 9. To be specific, the joint 16 connects the rear end portion of each of the first linear portions 10 with the second connecting portion 14 and also connects the front end portion of each of the second linear portions 13 with the first connecting portion 11.

In the lead frame 4' with a joint, the above-described spaces 2 are formed.

The lead frame 4' with a joint is formed into a generally rectangular flat plate shape in plane view. A flat plate (a metal plate) formed of the above-described conductive material is subjected to a punching process in which a stamping method is performed using a metal mold that corresponds to the spaces 2 or an etching process to form the spaces 2, so that the lead frame 4' with a joint is prepared.

Next, in this method, as shown in FIGS. 3 (a) and 3 (b), the light reflective first insulating resin portion 5 fills the spaces 2. At the same time with this, the second insulating resin portions 6 are formed on the side surfaces of the element-connecting board 1.

When the first insulating resin portion 5 and the second insulating resin portions 6 are formed from the same reflecting resin composition, for example, the above-described reflecting resin composition fills the spaces 2 by a forming process such as a transfer forming, a compression forming, a thermal press forming, or a lamination forming to form the first insulating resin portion 5 and the reflecting resin composition is applied to the side surfaces of the lead frame 4 to form the second insulating resin portions 6.

In the above-described forming, the reflecting resin composition is heated, so that when the reflecting resin composition contains a silicone resin composition, it is brought into a B-stage state (a semi-cured state).

A structure which is provided with the lead frame 4' with a joint, the first insulating resin portion 5 filling the spaces 2 of the lead frame 4' with a joint, and the second insulating resin portions 6 formed on the side surfaces of the lead frame 4' with a joint can be obtained as the element-connecting board 1 before the joint 16 is cut off.

Thereafter, as shown by cutting plane lines CL1 in FIGS. 3 (a) and 3 (b), the joint 16 is cut off.

In order to cut off the joint 16, the joint 16 is removed by, for example, a punching process or an etching process.

By cutting off the joint 16, as shown in FIGS. 1 (a) and 1 (b), the lead frame 4 which is provided with the first lead 8 and the second lead 9 is formed. That is, a circuit in which the first lead 8 and the second lead 9 are electrically insulated from each other is formed.

In this way, the element-connecting board 1 can be obtained.

Figure 5:
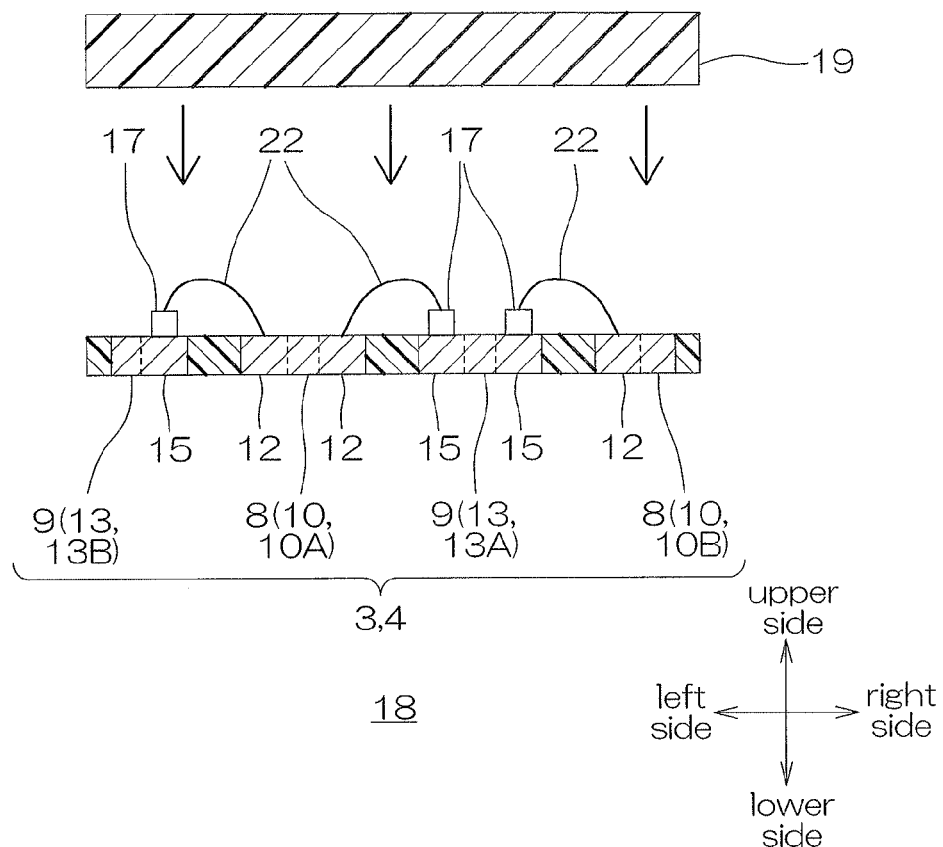
FIG. 5 shows a front sectional view for illustrating a step of attaching an encapsulating sheet to the element-connecting board.

FIG. 4 shows one embodiment of a light emitting diode device of the present invention. FIG. 5 shows a front sectional view for illustrating a step of attaching an encapsulating sheet to the element-connecting board.

In FIG. 4 (a), an encapsulating sheet 19 is omitted so as to clearly show the relative arrangement of the lead frame 4 and the light emitting diode elements 17.

The light emitting diode elements 17 are connected to the element-connecting board 1.

Next, a light emitting diode device 18 in which the light emitting diode elements 17 are connected to the element-connecting board 1 is described.

As shown in FIGS. 4 (a) and 4 (b), the light emitting diode device 18 includes the element-connecting board 1, the light emitting diode elements 17 connected to the upper surface (one surface in the thickness direction) of the element-connecting board 1, and the encapsulating sheet 19 (ref: FIG. 4 (b)) encapsulating the light emitting diode elements 17.

A plurality of the light emitting diode elements 17 are provided and to be specific, are mounted on the upper surfaces (one surface in the thickness direction) of the second pads 15 of the second lead 9. To be more specific, the lower surfaces of the light emitting diode elements 17 are adhered to the upper surfaces of the second pads 15 via an electrically-conductive adhesive layer which is not shown. That is, the lower surfaces of the light emitting diode elements 17 are electrically connected to the upper surface of the second lead 9.

On the other hand, the light emitting diode elements 17 are electrically connected to the upper surfaces of the first pads 12 of the first lead 8 via wires 22 connected to the upper surfaces of the light emitting diode elements 17. That is, the upper surfaces of the light emitting diode elements 17 are electrically connected to the first pads 12 which are disposed in opposed relation to the second pads 15 in the widthwise direction on which the light emitting diode elements 17 are mounted. That is, the upper surfaces of the light emitting diode elements 17 are electrically connected to the upper surface of the first lead 8.

The encapsulating sheet 19 is formed into a generally rectangular shape in plane view and is formed on (at one side in the thickness direction of) the element-connecting board 1. An example of the encapsulating sheet 19 includes an encapsulating sheet described in Japanese Unexamined Patent Publication No. 2011-159874.

In order to produce the light emitting diode device 18, the element-connecting board 1 shown in FIGS. 1 (*a*) and 1 (*b*) is prepared. Next, as shown in FIGS. 4 (*a*) and 4 (*b*), the light emitting diode elements 17 are connected to a plurality of the leads 3. Thereafter, as shown in FIG. 5, the encapsulating sheet 19 is disposed at the upper side of the light emitting diode elements 17 and the wires 22 so as to be overlapped with at least the light emitting diode elements 17 and the wires 22 when projected in the thickness direction. Subsequently, as shown by arrows in FIG. 5, the encapsulating sheet 19 is attached to the element-connecting board 1 so as to embed the light emitting diode elements 17 and the wires 22 to be thereafter heated. By this heating, when the first insulating resin portion 5 and the second insulating resin portions 6 are prepared from the reflecting resin composition (the encapsulating resin composition), the first insulating resin portion 5 and the second insulating resin portions 6 are brought into a C-stage state (a completely cured state).

Thereafter, as shown in FIG. 4 (*a*), each of the first lead 8 and the second lead 9 is connected to a power source 21 via power distribution lines 20.

In this way, the light emitting diode device 18 is obtained.

In the element-connecting board 1 obtained by the above-described method, the first insulating resin portion 5 fills the spaces 2 of the lead frame 4, so that both of the upper surface of the lead frame 4 and the upper surface of the first insulating resin portion 5 can be exposed.

Therefore, when the light emitting diode elements 17 are connected to the upper side of the lead frame 4, thereafter, the light emitting diode elements 17 are easily and surely covered with the encapsulating sheet 19, so that the light emitting diode elements 17 can be easily and surely encapsulated.

The first insulating resin portion 5 has light reflectivity, so that the element-connecting board 1 has an excellent light reflectivity. Therefore, in the light emitting diode device 18 including the element-connecting board 1, light emitted from the light emitting diode elements 17 can be reflected, so that the luminous efficiency can be improved.

In addition, in the element-connecting board 1, the first insulating resin portion 5 fills the spaces 2 separating a plurality of the leads 3, so that a plurality of the leads 3 can be surely supported to be reinforced.

Furthermore, the side surfaces of the lead frame 4 can be laterally supported to be reinforced by the second insulating resin portions 6.

In the light emitting diode device 18, the light emitting diode elements 17 connected to the element-connecting board 1 can be easily and surely encapsulated by the above-described encapsulating sheet 19. Therefore, the reliability of the light emitting diode device 18 can be easily and surely improved.

In the above-described method, the shape of the lead frame 4' with a joint in which a plurality of the leads 3 are connected by the joint 16 is maintained, and the first insulating resin portion 5 surely fills the spaces 2 of the lead frame 4' with a joint and a plurality of the leads 3 can be surely supported.

By cutting off the joint 16, a desired circuit consisting of a plurality of the leads 3 can be formed.

Figure 6:
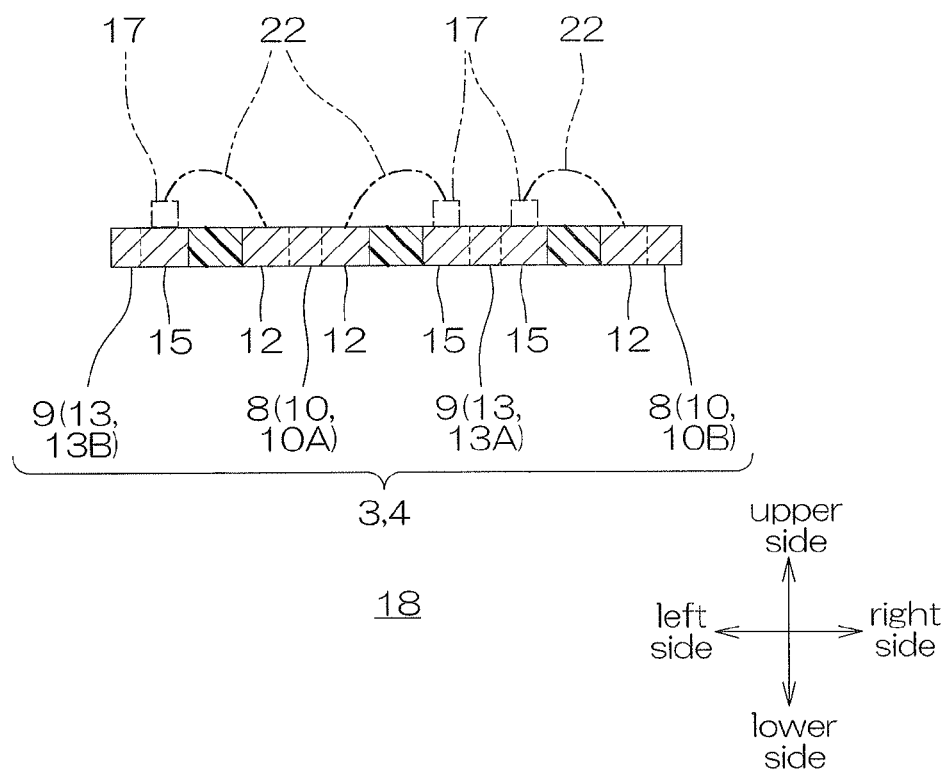
FIG. 6 shows a front sectional view for illustrating another embodiment (an embodiment in which side surfaces of the lead frame are exposed) of the element-connecting board of the present invention.
Figure 7:
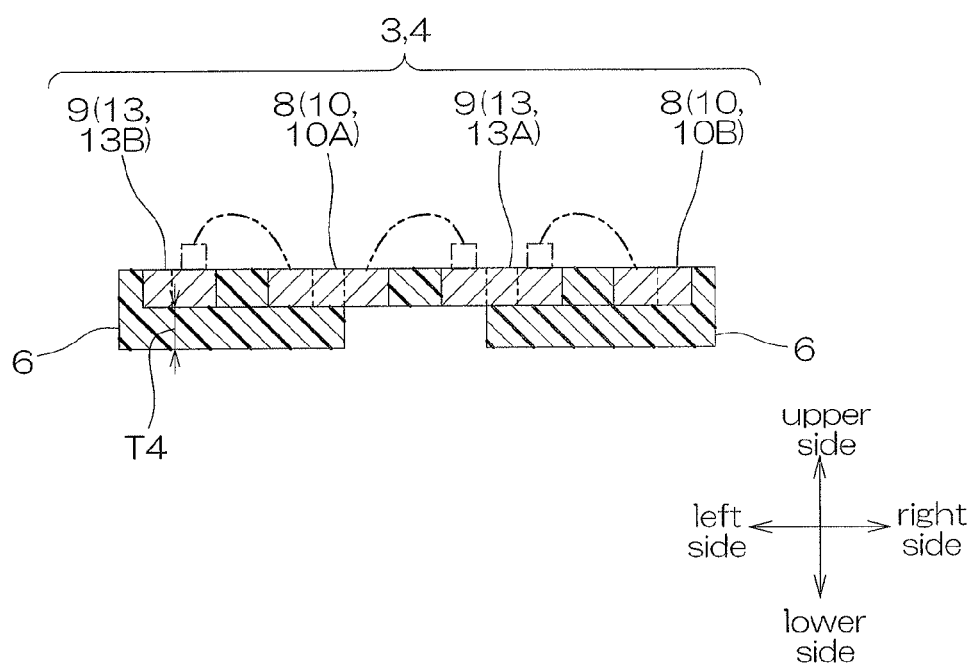
FIG. 7 shows a front sectional view for illustrating another embodiment (an embodiment in which second insulating resin portions are formed on the lower surface of the lead frame) of the element-connecting board of the present invention.

FIG. 6 shows a front sectional view for illustrating another embodiment (an embodiment in which side surfaces of the lead frame are exposed) of the element-connecting board of the present invention. FIG. 7 shows a front sectional view for illustrating another embodiment (an embodiment in which second insulating resin portions are formed on the lower surface of the lead frame) of the element-connecting board of the present invention. FIG. 8 shows another embodiment of an element-connecting board of the present invention. FIG. 9 shows a lead frame used in a method for producing the element-connecting board shown in FIG. 8. FIG. 10 shows another embodiment of a light emitting diode device of the present invention. FIG. 11 shows an embodiment of dividing the element-connecting board shown in FIG. 8 into two pieces.

In each figure to be described below, the same reference numerals are provided for member corresponding to each of those described above, and their detailed description is omitted.

In the embodiment in FIG. 1, the second insulating resin portions 6 are formed on the side surfaces of the lead frame 4. Alternatively, for example, as shown in FIG. 6, the second insulating resin portions 6 are not formed on the side surfaces of the lead frame 4 and the side surfaces of the lead frame 4 can be exposed.

In FIG. 6, the right side surface of the first linear portion 10B at the right side of the first lead 8 and the left side surface of the second linear portion 13B at the left side of the second lead 9 are exposed.

In the embodiments in FIGS. 1 and 6, the lower surface (the other surface in the thickness direction) of the lead frame 4 is exposed. Alternatively, for example, as shown in FIG. 7, the lower surface of the lead frame 4 can be covered with the second insulating resin portions 6.

In FIG. 7, the second insulating resin portions 6 are provided on the portions of the lower surface of the lead frame 4 in addition to the side surfaces thereof. That is, the second insulating resin portions 6 are provided on the lower surface of the lead frame 4 at the both end portions in the widthwise direction.

To be specific, each of the second insulating resin portions 6 provided on the lower surface of the lead frame 4 is continuously formed on the lower surface of the first linear portion 10B at the right side, the lower surface of the second linear portion 13A at the right side, and the lower surface of the second insulating resin portion 6 which fills the space 2 between the first linear portion 10B at the right side and the second linear portion 13A at the right side. Also, each of the second insulating resin portions 6 provided on the lower surface of the lead frame 4 is continuously formed on the lower surface of the second linear portion 13B at the left side, the lower surface of the first linear portion 10A at the left side, and the lower surface of the second insulating resin portion 6 which fills the space 2 between the second linear portion 13B at the left side and the first linear portion 10A at the left side.

A thickness T4 of each of the second insulating resin portions 6 provided on the lower surface of the lead frame 4 is, for example, 50 to 2000 µm, or preferably 100 to 300 µm.

The embodiment in FIG. 7 can achieve the same function and effect as that of the embodiment in FIG. 1. In addition, by each of the second insulating resin portions 6 provided on the lower surface of the lead frame 4, the lead frame 4 can be supported from below to be reinforced.

In the embodiments in FIGS. 1 (a) and 1 (b), each of the first lead 8 and the second lead 9 is provided with the first pads 12 and the second pads 15. Alternatively, for example, as shown in FIGS. 8 (a) and 8 (b), the first lead 8 and the second lead 9 can be formed without providing the first pads 12 and the second pads 15.

In FIGS. 8 (a) and 8 (b), the element-connecting board 1 includes the lead frame 4 which is provided with a plurality of the leads 3, the first insulating resin portion 5 which is light reflective and fills the spaces 2, and the second insulating resin portions 6 which are formed on the side surfaces of the lead frame 4.

A plurality of the leads 3 include the first lead 8 disposed at the center in the widthwise direction and the second leads 9 each of which is disposed in opposed relation to the first lead 8 with the spaces 2 therebetween at the both outer sides in the widthwise direction of the first lead 8.

The first lead 8 is formed into a generally wide rectangular shape in plane view extending in the front-rear direction.

Each of the second leads 9 is narrower than the first lead 8 and is formed into a generally rectangular shape in plane view extending long in the front-rear direction.

The first insulating resin portion 5 fills the spaces 2 which are formed between the first lead 8 and each of the second leads 9.

The second insulating resin portions 6 are formed at the outer side surfaces in the widthwise direction of each of the second leads 9.

In order to obtain the element-connecting board 1 in FIG. 8, for example, first, the lead frame 4 shown in FIGS. 9 (a) and 9 (b) is prepared. In the lead frame 4, each of the both end portions in the front-rear direction of the first lead 8 is connected to each of the both end portions in the front-rear direction of each of the second leads 9 by a joint which is not shown. The resulting lead frame 4 is defined as the lead frame 4' with a joint.

Next, as shown in FIGS. 8 (a) and 8 (b), the first insulating resin portion 5 and the second insulating resin portions 6 are formed from the reflecting resin composition.

In this way, the element-connecting board 1 is obtained.

As shown in FIGS. 10 (a) and 10 (b), the light emitting diode elements 17 are connected to the element-connecting board 1 to constitute the light emitting diode device 18.

In the light emitting diode device 18, the light emitting diode elements 17 are provided at the both end portions in the widthwise direction of the first lead 8 and are disposed at spaced intervals to each other along the front-rear direction of the first lead 8.

The light emitting diode elements 17 are adhered to the upper surface of the first lead 8 via an electrically-conductive adhesive layer which is not shown. In this way, the light emitting diode elements 17 are electrically connected to the upper surface of the first lead 8.

On the other hand, the light emitting diode elements 17 are electrically connected to the upper surfaces of the second leads 9 via the wires 22 connected to the upper surfaces of the light emitting diode elements 17. That is, the upper surfaces of the light emitting diode elements 17 are electrically connected to the upper surfaces of the second leads 9.

The embodiments shown in FIGS. 10 (a) and 10 (b) can achieve the same function and effect as that of the embodiment shown in FIG. 4. In addition, each of the light emitting diode elements 17 and the wires 22 can be also connected to the upper surfaces of the first lead 8 and the second leads 9. Therefore, in the light emitting diode device 18, the lead frame 4 includes the first lead 8 and the second leads 9 in the above-described shapes, so that a simple structure can be achieved.

The size of the element-connecting board 1 in FIG. 8 can be appropriately selected. As shown in FIG. 11, for example, the element-connecting boards 1 can be also divided into a plurality of pieces (two pieces) so as to be divided in the front-rear direction by a cutting plane line CL2 shown by a dashed line in FIG. 11 (a) by a cutting process such as a dicing method.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An element-connecting board comprising:
   a lead frame for allowing a light emitting diode element to be connected to one side thereof in a thickness direction, which is provided with a first lead and a second lead disposed with a space from the first lead, and
   a first insulating resin portion which is light reflective and fills the spaces,
   wherein a thickness of the first insulating resin portion is substantially the same as the thickness of the lead frame,
   the first lead integrally includes:
   a plurality of first linear portions which are disposed in alignment at spaced intervals to each other and extend in a direction perpendicular to an alignment direction of the plurality of first linear portions; and
   a first connecting portion which extends in the alignment direction and connects end portions on one side of the plurality of first linear portions,
   the second lead integrally includes:
   a plurality of second linear portions which are disposed in alignment at spaced intervals to each other and alternately with the plurality of first linear portions in the alignment direction and extend parallel to the plurality of first linear portions; and
   a second connecting portion which extends in the alignment direction and connects end portions on another side, which is opposite to the one side, of the plurality of second linear portions,
   the first connecting portion is disposed at a spaced interval from the first insulating resin portion on the one side,
   the second connecting portion is disposed at a spaced interval from the first insulating resin portion on the other side,
   end portions on the other side of the plurality of first linear portions are spaced apart from the second connecting portion, and
   end portions on the one side of the plurality of second linear portions are spaced apart from the first connecting portion.

2. The element-connecting board according to claim 1, wherein the first insulating resin portion is formed from a reflecting resin composition containing an encapsulating resin composition and a light reflecting component.

3. The element-connecting board according to claim 1, wherein
a second insulating resin portion which is disposed at the other surface in the thickness direction and/or the side surface of the lead frame is further included.

4. The element-connecting board according to claim 3, wherein a thickness of the second insulating resin portions is substantially the same as the thickness of the lead frame.

5. A method for producing the element-connecting board according to claim 1, comprising the steps of:
preparing the lead frame provided with the first lead, the second lead, and a joint connecting the first lead and the second lead,
allowing the first insulating resin portion to fill the spaces so as to provide a space on the other side of the first connecting portion and a space on the one side of the second connecting portion, and
cutting off the joint outside of the first insulating resin portion on the one side and the other side.

6. The element-connecting board according to claim 1, wherein
in each of the plurality of the first linear portions, first pads for electrically being connected to light emitting diode elements via wires are disposed in alignment at spaced intervals to each other in a direction in which the each of the plurality of first linear portions extends,
and in each of the plurality of second linear portions, second pads for electrically being connected and mounted to the light emitting diode elements are disposed in alignment at spaced intervals to each other in a direction in which the each of the plurality of second linear portions extends.

7. A light emitting diode device comprising:
an element-connecting board including a lead frame which is provided with a first lead and a second lead disposed with a space from the first lead and a first insulating resin portion which is light reflective and fills the spaces, wherein a thickness of the first insulating resin portion is substantially the same as the thickness of the lead frame, and
a light emitting diode element connected to one surface in a thickness direction of the lead frame,
the first lead integrally includes:
a plurality of first linear portions which are disposed in alignment at spaced intervals to each other and extend in a direction perpendicular to an alignment direction of the plurality of first linear portions; and
a first connecting portion which extends in the alignment direction and connects end portions on one side of the plurality of first linear portions,
the second lead integrally includes:
a plurality of second linear portions which are disposed in alignment at spaced intervals to each other and alternately with the plurality of first linear portions in the alignment direction and extend parallel to the plurality of first linear portions; and
a second connecting portion which extends in the alignment direction and connects end portions on another side, which is opposite to the one side, of the plurality of second linear portions,
the first connecting portion is disposed at a spaced interval from the first insulating resin portion on the one side,
the second connecting portion is dispose at a spaced interval from the first insulating resin portion on the other side,
end portions on the other side of the plurality of first linear portions are spaced apart from the second connecting portion, and
end portions on the one side of the plurality of second linear portions are spaced apart from the first connecting portion.

8. The light emitting diode device according to claim 7, wherein
an encapsulating sheet which is formed at one side in the thickness direction of the element-connecting board and encapsulates the light emitting diode element is further included.

9. The light emitting diode device according to claim 7, wherein
in each of the plurality of the first linear portions, first pads for electrically being connected to light emitting diode elements via wires are disposed in alignment at spaced intervals to each other in a direction in which the each of the plurality of first linear portions extends,
and in each of the plurality of second linear portions, second pads for electrically being connected and mounted to the light emitting diode elements are disposed in alignment at spaced intervals to each other in a direction in which the each of the plurality of second linear portions extends.

* * * * *